United States Patent
Cao et al.

(10) Patent No.: US 10,096,725 B2
(45) Date of Patent: Oct. 9, 2018

(54) METHOD FOR GRADED ANTI-REFLECTIVE COATINGS BY PHYSICAL VAPOR DEPOSITION

(71) Applicant: Applied Materials, Inc., Santa Clara, CA (US)

(72) Inventors: Yong Cao, San Jose, CA (US); Daniel Lee Diehl, Chiba (JP); Rongjun Wang, Dublin, CA (US); Xianmin Tang, San Jose, CA (US); Tai-chou Papo Chen, San Jose, CA (US); Tingjun Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 352 days.

(21) Appl. No.: 14/531,549

(22) Filed: Nov. 3, 2014

(65) Prior Publication Data
US 2015/0132551 A1    May 14, 2015

Related U.S. Application Data

(60) Provisional application No. 61/887,147, filed on Nov. 13, 2013, provisional application No. 61/904,437, filed on Nov. 14, 2013.

(51) Int. Cl.
*C23C 14/35* (2006.01)
*H01L 31/0216* (2014.01)
(Continued)

(52) U.S. Cl.
CPC .... *H01L 31/02161* (2013.01); *C23C 14/0042* (2013.01); *C23C 14/0084* (2013.01);
(Continued)

(58) Field of Classification Search
CPC ............ C23C 14/0042; C23C 14/0084; C23C 14/0652; C23C 14/0676; C23C 14/35;
(Continued)

(56) References Cited

U.S. PATENT DOCUMENTS 4,883,574 A * 11/1989 dos Santos Pereina Ribeiro ........ C23C 14/35 204/192.15
5,234,748 A * 8/1993 Demiryont ........ B32B 17/10174 428/212

(Continued)

*Primary Examiner* — Rodney G McDonald
(74) *Attorney, Agent, or Firm* — Patterson + Sheridan, LLP

(57) ABSTRACT

A method for forming an anti-reflective coating (ARC) includes positioning a substrate below a target and flowing a first gas to deposit a first portion of the graded ARC onto the substrate. The method includes gradually flowing a second gas to deposit a second portion of the graded ARC, and gradually flowing a third gas while simultaneously gradually decreasing the flow of the second gas to deposit a third portion of the graded ARC. The method also includes flowing the third gas after stopping the flow of the second gas to form a fourth portion of the graded ARC. In another embodiment a film stack having a substrate having a graded ARC disposed thereon is provided. The graded ARC includes a first portion, a second portion disposed on the first portion, a third portion disposed on the second portion, and a fourth portion disposed on the third portion.

14 Claims, 3 Drawing Sheets

(51) Int. Cl.
*H01L 31/18* (2006.01)
*G02B 1/115* (2015.01)
*C23C 14/00* (2006.01)
*C23C 14/06* (2006.01)

(52) U.S. Cl.
CPC ...... *C23C 14/0652* (2013.01); *C23C 14/0676* (2013.01); *C23C 14/35* (2013.01); *G02B 1/115* (2013.01); *H01L 31/02168* (2013.01); *H01L 31/18* (2013.01); *Y02E 10/50* (2013.01); *Y10T 428/24942* (2015.01)

(58) Field of Classification Search
CPC .............. G02B 1/115; H01L 31/02161; H01L 31/02168
USPC ............. 204/192.16, 192.26, 192.27, 192.28
See application file for complete search history.

(56) References Cited

U.S. PATENT DOCUMENTS

| | | | | |
|---|---|---|---|---|
| 5,651,865 A | * | 7/1997 | Sellers | ................ C23C 14/0036 204/192.12 |
| 6,495,251 B1 | * | 12/2002 | Arbab | ................. C03C 17/3435 428/212 |
| 2012/0048722 A1 | * | 3/2012 | McLean | ............. C03C 17/3435 204/192.1 |

* cited by examiner

METHOD FOR GRADED ANTI-REFLECTIVE COATINGS BY PHYSICAL VAPOR DEPOSITION

CROSS-REFERENCE TO RELATED APPLICATIONS

This application claims benefit of U.S. Provisional Application Ser. No. 61/887,147, filed Nov. 13, 2013 and U.S. Provisional Application Ser. No. 61/904,437, filed Nov. 14, 2013, both of which are incorporated by reference in their entirety.

BACKGROUND OF THE DISCLOSURE

Field of the Invention

Embodiments of the invention generally relate to a method of forming an anti-reflective coating (ARC), and more particularly, for forming an ARC with a graded refractive index.

Description of the Background Art

Many of the materials used in manufacturing solar cells, for example silicon, have high refractive indices and result in loss of incident sunlight by reflection. Thin film materials having a series of layers of metals and dielectrics of varying dielectric constants and refractive indices, such as a graded anti-reflective coating (ARC), are used to reduce glare or reflection.

Graded ARCs are often deposited by chemical vapor deposition (CVD) or plasma enhanced CVD (PECVD). However, CVD and PECVD pose a challenge because they require deposition at higher temperatures and incorporate large amounts of hydrogen, therefore resulting in impurities and low film quality.

Therefore, there is a need for an improved method of forming an ARC with a graded refractive index.

SUMMARY OF THE INVENTION

The present invention provides methods for forming an anti-reflective coating (ARC), and more particularly, for forming an ARC with a graded refractive index.

In one embodiment a method for forming a graded anti-reflective ARC in a physical vapor deposition processing chamber is provided. The method includes positioning a substrate on a substrate support below a target and flowing a first gas into the processing chamber to sputter the target to deposit a first portion of the graded ARC onto the substrate. The method also includes gradually flowing a second gas into the processing chamber to deposit a second portion of the graded ARC onto the substrate. The method further includes gradually flowing a third gas into the processing chamber while simultaneously gradually decreasing the flow of the second gas into the processing chamber to deposit a third portion of the graded ARC onto the substrate. The method also includes flowing the third gas into the processing chamber after stopping the flow of the second gas to form a fourth portion of the graded ARC.

In another embodiment another method for forming a graded anti-reflective ARC in a physical vapor deposition processing chamber is provided. The method includes positioning a substrate on a substrate support below a silicon target and sputtering the silicon target to deposit a first portion of the graded ARC onto the substrate. The method also includes gradually flowing nitrogen gas into the processing chamber to deposit a second portion of the graded ARC onto the substrate. The method further includes gradually flowing oxygen gas into the processing chamber while simultaneously gradually decreasing the flow of the nitrogen gas into the processing chamber to deposit a third portion of the graded ARC onto the substrate. The method also includes flowing the oxygen gas into the processing chamber after stopping the flow of the nitrogen gas to form a fourth portion of the graded ARC onto the substrate.

In yet another embodiment a film stack having a substrate having a graded ARC disposed thereon is provided. The graded ARC includes a first portion, a second portion disposed on the first portion, a third portion disposed on the second portion, and a fourth portion disposed on the third portion. The first portion has a first refractive index and the second portion has a second refractive index that is less than the first refractive index. The third portion has a third refractive index that is less than the second refractive index. The fourth portion has a fourth refractive index that is less than the third refractive index.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
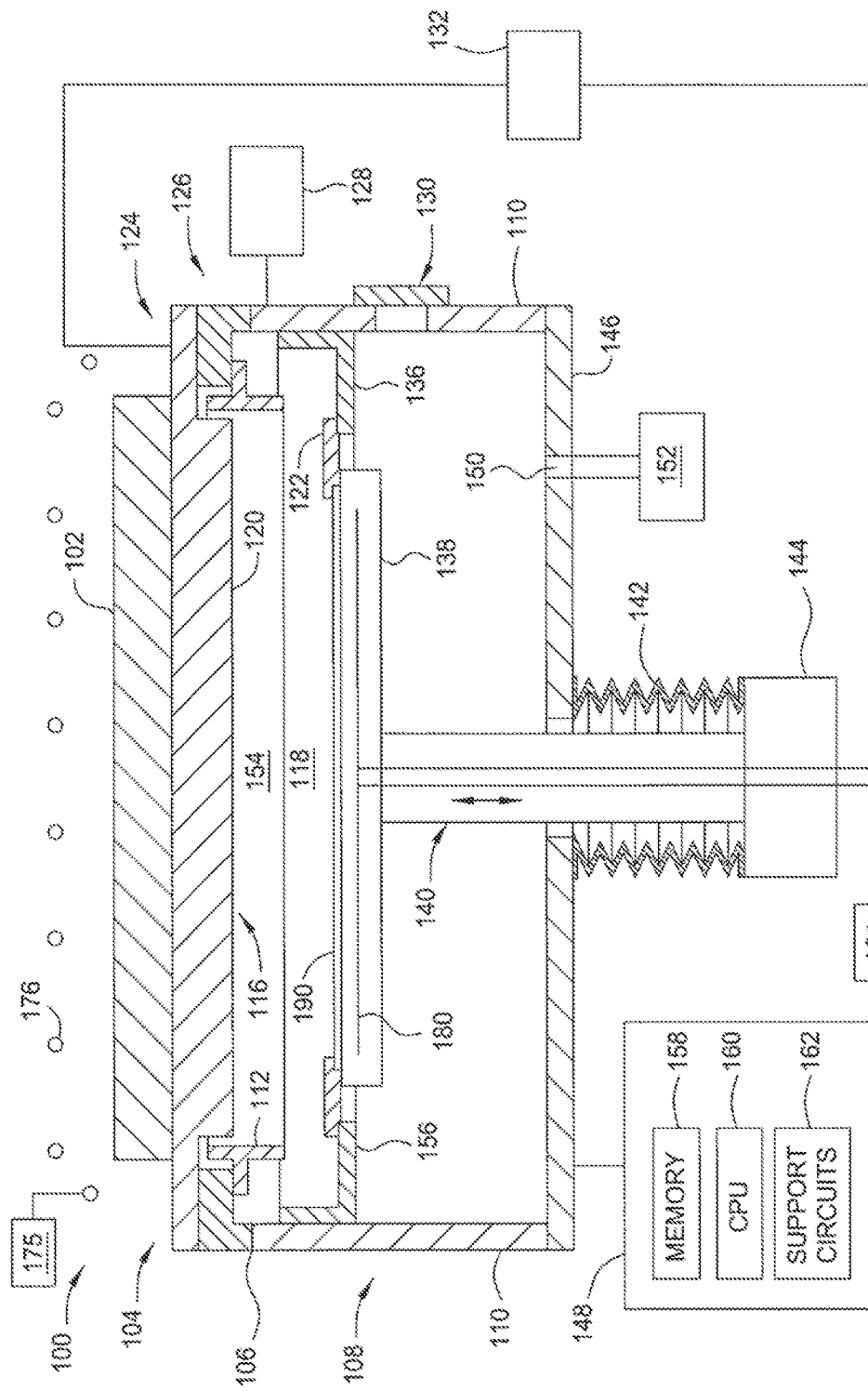
FIG. 1 depicts a schematic cross-sectional view of a process chamber according to one embodiment of the invention.

FIG. 1 illustrates an exemplary physical vapor deposition (PVD) process chamber 100 (e.g., a sputter process chamber) suitable for sputter depositing materials according to one embodiment of the invention. One example of the process chamber 100 that may be adapted to benefit from the invention is a PVD process chamber, available from Applied Materials, Inc., located in Santa Clara, Calif. It is contemplated that other sputter process chambers, including those from other manufactures, may be adapted to practice the present invention.

The process chamber 100 includes a chamber body 108 having a processing volume 118 defined therein. The chamber body 108 has sidewalls 110 and a bottom 146. The dimensions of the chamber body 108 and related components of the process chamber 100 are not limited and are generally proportionally larger than the size of a substrate 190 to be processed. Any suitable substrate size may be processed. Examples of suitable substrate sizes include substrates with a 200 mm diameter or 300 mm diameter.

A chamber lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of the substrate 190 into and out of the process chamber 100. The access port 130 may be coupled to a transfer chamber and/or other chambers of a substrate processing system.

A gas source 128 is coupled to the chamber body 108 to supply process gases into the processing volume 118. In one embodiment, process gases may include inert gases, non-reactive gases, and reactive gases if necessary.

Examples of process gases that may be provided by the gas source 128 include, but not limited to, argon gas (Ar), helium (He), neon gas (Ne), nitrogen gas ($N_2$), fluorine gas ($F_2$), oxygen gas ($O_2$), hydrogen gas (H2), $H_2O$ in vapor form, methane (CH4), carbon monoxide (CO), methane ($CH_4$), and/or carbon dioxide ($CO_2$), among others. In one embodiment, a mass flow controllers (MFC) is coupled to the gas source 128 to finely and precisely control of the flow of gases.

A pumping port 150 is formed through the bottom 146 of the chamber body 108. A pumping device 152 is coupled to the processing volume 118 to evacuate and control the pressure therein. A pumping system and chamber cooling design enables high base vacuum (about $1 \times 10^{-8}$ Torr or less) and low rate-of-rise (about 1,000 mTorr/min) at temperatures suited to thermal budget needs, e.g., about −25 degrees Celsius to about 500 degrees Celsius. The pumping system is designed to provide precise control of process pressure which is a critical parameter for refractive index (RI) control and tuning.

The lid assembly 104 generally includes a target 120 and a ground shield assembly 126 coupled thereto. The target 120 provides a material source that can be sputtered and deposited onto the surface of the substrate 190 during a PVD process. The target 120 serves as the cathode of the plasma circuit during DC sputtering.

The target 120 or target plate may be fabricated from a material utilized for a deposition layer, or elements of the deposition layer to be formed in the process chamber 100. A high voltage power supply, such as a power source 132, is connected to the target 120 to facilitate sputtering materials from the target 120.

In one embodiment, the target 120 may be fabricated from a material containing silicon (Si), titanium (Ti), tantalum (Ta), hafnium (Hf), tungsten (W), cobalt (Co), nickel (Ni), copper (Cu), aluminum (Al), alloys thereof, or combinations thereof and the like. In one embodiment depicted herein, the target may be fabricated from silicon.

The target 120 generally includes a peripheral portion 124 and a central portion 116. The peripheral portion 124 is disposed over the sidewalls 110 of the chamber. The central portion 116 of the target 120 may have a curvature surface slightly extending towards the surface of the substrate 190 disposed on a substrate support 138. The spacing between the target 120 and the substrate support 138 is maintained between about 50 mm to about 350 mm, for example, about 55 mm. It is contemplated that the dimension, shape, materials, configuration and diameter of the target 120 may be varied for specific process or substrate requirements. In one embodiment, the target 120 may further include a backing plate having a central portion bonded and/or fabricated by a material desired to be sputtered onto the substrate surface.

The target 120 may also include adjacent tiles or segmented materials that together form the target 120.

The lid assembly 104 may further comprise a full face erosion magnetron cathode 102 mounted above the target 120 which enhances efficient sputtering materials from the target 120 during processing. The full face erosion magnetron cathode 102 allows easy and fast process control and tailored film properties while ensuring consistent target erosion and uniform deposition of films, such as $SiO_xN_y$, across the wafer for a variety of values of x and y ranging from 0% to 100%. Examples of the magnetron assembly include a linear magnetron, a serpentine magnetron, a spiral magnetron, a double-digitated magnetron, a rectangularized spiral magnetron, among others.

The ground shield assembly 126 of the lid assembly 104 includes a ground frame 106 and a ground shield 112. The ground shield assembly 126 may also include other chamber shield member, target shield member, dark space shield, and dark space shield frame. The ground shield 112 is coupled to the peripheral portion 124 by the ground frame 106 defining an upper processing region 154 below the central portion of the target 120 in the processing volume 118. The ground frame 106 electrically insulates the ground shield 112 from the target 120 while providing a ground path to the chamber body 108 of the process chamber 100 through the sidewalls 110. The ground shield 112 constrains plasma generated during processing within the upper processing region 154 and dislodges target source material from the confined central portion 116 of the target 120, thereby allowing the dislodged target source to be mainly deposited on the substrate surface rather than chamber sidewalls 110. In one embodiment, the ground shield 112 may be formed by one or more work-piece fragments and/or a number of these pieces bonding by processes known in the art, such as welding, gluing, high pressure compression, etc.

A shaft 140 extending through the bottom 146 of the chamber body 108 couples to a lift mechanism 144. The lift mechanism 144 is configured to move the substrate support 138 between a lower transfer position and an upper processing position. Bellows 142 circumscribe the shaft 140 and are coupled to the substrate support 138 to provide a flexible seal there between, thereby maintaining vacuum integrity of the chamber processing volume 118.

The substrate support 138 provides an electro-static chuck (ESC) 180. The ESC 180 uses the attraction of opposite charges to hold both insulating and conducting substrates 190 for PVD processes and is powered by a DC power supply 181. The ESC 180 comprises an electrode embedded within a dielectric body. The DC power supply 181 may provide a DC chucking voltage of about 200 volts to about 2000 volts to the electrode. The DC power supply 181 may also include a system controller for controlling the operation of the electrode by directing a DC current to the electrode for chucking and de-chucking the substrate 190.

The ESC 180 performs in the temperature range required by the thermal budget of the device integration requirements formed by the substrate 190. For example, the temperature range for: (i) a detachable ESC 180 (DTESC) is about minus 25 degrees Celsius to about 100 degrees; (ii) a mid-temperature ESC 180 (MTESC) is about 100 degrees Celsius to about 200 degrees Celsius; (iii) a high temperature or high temperature biasable or high temperature high uniformity ESC 180 (HTESC or HTBESC or HTHUESC) is about 200 degrees Celsius to about 500 degrees Celsius, to ensure fast and uniform heating of the substrate 190. Additionally, any of the ESCs may be used without being heated, i.e., at room temperature.

After the process gas is introduced into the process chamber 100, the gas is energized to form plasma. A plasma is commonly formed from an inert gas, such as argon, before a reactive gas is introduced into the process chamber 100. An antenna 176, such as one or more inductor coils, may be provided adjacent the process chamber 100. An antenna power supply 175 may power the antenna 176 to inductively couple energy, such as RF energy, to the process gas to form plasma in a process zone in the process chamber 100. Alternatively, or in addition, process electrodes comprising a cathode below the substrate 190 and an anode above the substrate 190 may be used to couple RF power to generate plasma. The operation of the power source 175 may be controlled by a controller that also controls the operation of other components in the process chamber 100.

A shadow frame 122 is disposed on the periphery region of the substrate support 138 and is configured to confine deposition of source material sputtered from the target 120 to a desired portion of the substrate 190 surface. A chamber shield 136 may be disposed on the inner wall of the chamber body 108 and have a lip 156 extending inward to the processing volume 118 configured to support the shadow frame 122 disposed around the substrate support 138. As the substrate support 138 is raised to the upper position for processing, an outer edge of the substrate 114 disposed on the substrate support 138 is engaged by the shadow frame 122 and the shadow frame 122 is lifted up and spaced away from the chamber shield 136. When the substrate support 138 is lowered to the transfer position adjacent to the substrate transfer access port 130, the shadow frame 122 is set back on the chamber shield 136. Lift pins (not shown) are selectively moved through the substrate support 138 to list the substrate 190 above the substrate support 138 to facilitate access to the substrate 190 by a transfer robot or other suitable transfer mechanism.

A controller 148 is coupled to the process chamber 100. The controller 148 includes a central processing unit (CPU) 160, a memory 158, and support circuits 162. The controller 148 is utilized to control the process sequence, regulating the gas flows from the gas source 128 into the process chamber 100 and controlling ion bombardment of the target 120. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 148 that controls the process chamber 100 such that the processes are performed in accordance with the present invention. The software routines may also be stored and/or executed by a second controller (not shown) that is located remotely from the process chamber 100.

During processing, material is sputtered from the target 120 and deposited on the surface of the substrate 190. The target 120 and the substrate support 138 are biased relative to each other by the power source 132 to maintain a plasma formed from the process gases supplied by the gas source 128. The ions from the plasma are accelerated toward and strike the target 120, causing target material to be dislodged from the target 120. The dislodged target material and reactive process gases together form a layer on the substrate 190 with desired compositions. RF, DC or fast switching pulsed DC power supplies or combinations thereof provide tunable target bias for precise control of sputtering composition and deposition rates.

Figure 2:
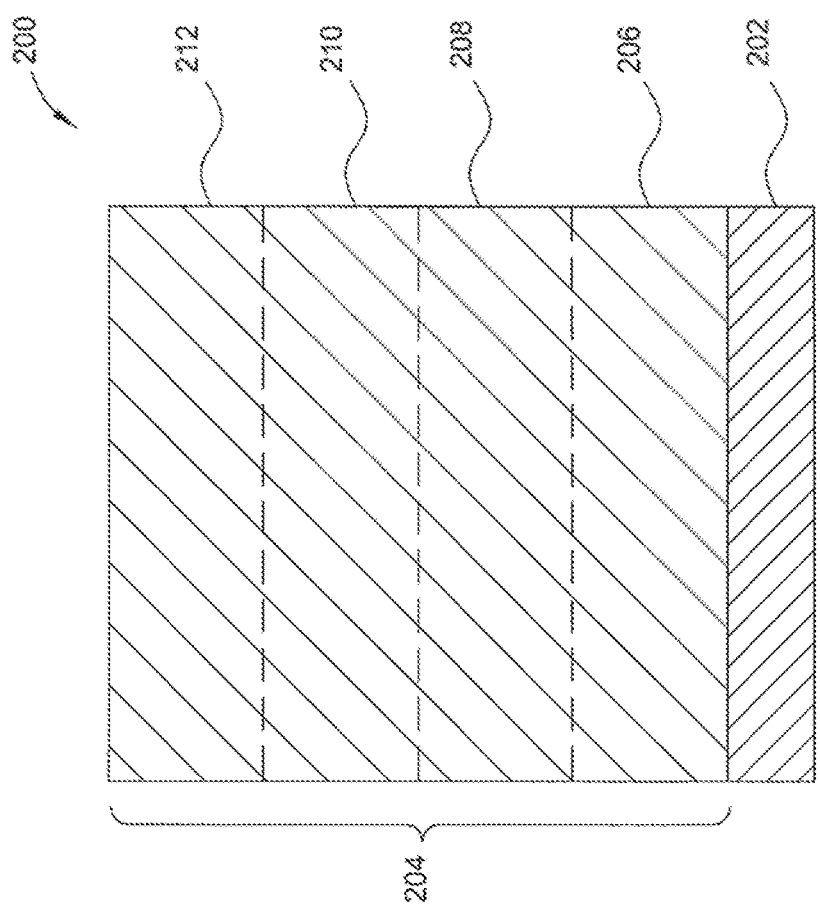
FIG. 2 depicts a cross sectional view of a filmstack having an anti-reflective coating (ARC) according to one embodiment of the invention.
Figure 3:
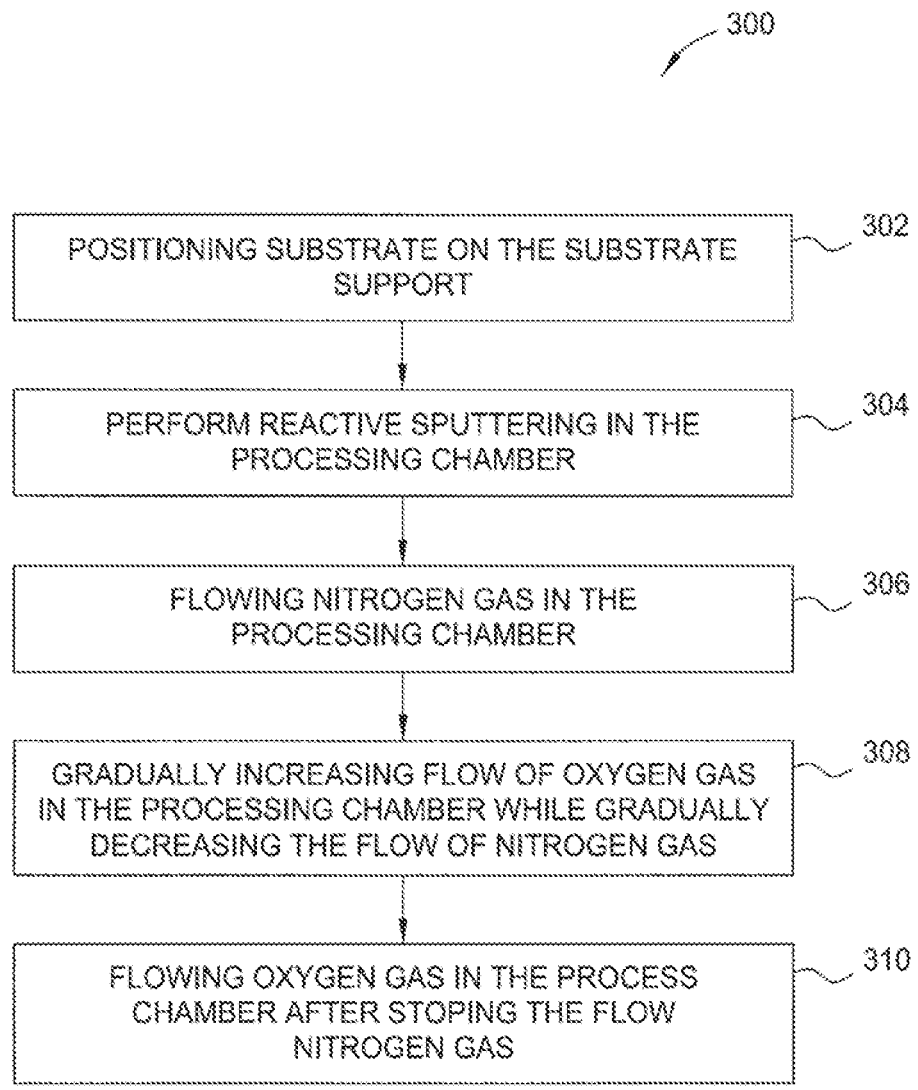
FIG. 3 depicts a process flow diagram for forming an ARC according to one embodiment of the invention.

FIG. 2 depicts a cross sectional view of a filmstack 200 having a graded ARC 204 according to one embodiment of the invention. FIG. 3 depicts a process flow diagram for forming the graded ARC 204. Referring to FIGS. 1-3, a method 300 for forming the graded ARC 204 begins at block 302 by positioning the substrate 190 on the substrate support 138 and below the target 120. In one embodiment, the substrate 190 has one or more layers formed thereon, e.g., a silicon substrate having a photodiode 202, and the substrate support 138 includes an HTESC 180. The substrate 202 is set about 55 mm away from the target 120, and the target 120 is fabricated from silicon. In one embodiment, the process chamber 100 pressure may be set to a low pressure, e.g., less than about 100 mTorr, or about 10 mTorr at room temperature. In one embodiment, the DC power supply 181 is pulsed to provide less than about 20 kW, for example about 6 kW, at a frequency of about 100 kHz and a duty cycle of about 97%.

At block 304, one or more sputtering gasses from the gas source 128 are flowed into the process chamber 100 to sputter the silicon target 120 to form a first portion 206 of the graded ARC 204 having silicon onto the substrate 202. In one embodiment, the sputtering gas is argon gas flowed at about 30 sccm.

At block 306, one or more reactive gasses from the gas source 128 are flowed into the process chamber 100 to react with the silicon target 120. In one embodiment, the reactive gas is selected from a group comprising nitrogen gas ($N_2$), nitrogen dioxide ($NO_2$), fluorine gas ($F_2$), oxygen gas ($O_2$), hydrogen gas (H2), $H_2O$ in vapor form, methane (CH4), carbon monoxide (CO), methane ($CH_4$), and carbon dioxide ($CO_2$). For example, in one embodiment, nitrogen gas is gradually introduced into the process chamber 100 to form nitrogen plasma. The nitrogen gas is gradually introduced until it reaches about 100 sccm to form a second portion 208 of the graded ARC 204 having silicon nitride ($SiN_x$ wherein x is between about 0% to about 100%). As noted by the phantom lines in FIG. 2, the change in the composition of the graded ARC 204 from silicon in the first portion 206 to silicon nitride in the second portion 208 is gradual, i.e., no distinct layers in each portion of the graded ARC 204.

At block 308, one or more reactive gasses from the gas source 128 is again flowed into the process chamber 100 to react with the silicon target 120. In one embodiment, oxygen gas is gradually introduced into the process chamber 100 to form oxygen plasma, while the flow of nitrogen gas is gradually decreased in the process chamber 100. The oxygen gas is gradually introduced until it reaches to about 50 sccm to about 100 sccm, for example about 50 sccm or about 100 sccm, to form a third portion 210 of the graded ARC 204 having $SiN_xO_y$, wherein x and y are between about 0% to about 100%. As discussed above, the change in the composition of the graded ARC 204 from silicon nitride in the second portion 208 to $SiN_xO_y$ in the third portion 210 is gradual, i.e., no distinct layers in each portion of the graded ARC 204.

At block 310, while the flow of oxygen gas is gradually increasing, the nitrogen gas is gradually reduced to 0 sccm to form a fourth portion 212 of the graded ARC 204 having silicon oxide $SiO_2$. The oxygen gas continues to flow after the flow of nitrogen gas stops. Beneficially, the gradual flow changes in nitrogen gas and oxygen gas prevents the plasma from being extinguished in the process chamber 100. As discussed above, the change in the composition of the graded ARC 204 from SiN$_x$O$_y$ in the third portion 210 to SiO$_2$ in the fourth portion 212 is gradual, i.e., no distinct layers in each portion of the graded ARC 204. In one embodiment, an optional buffer laying having oxide or nitride may be deposited over the graded ARC 204 to form a filmstack 202 configured for a complementary metal-oxide-semiconductor (CMOS) image sensor device.

Advantageously, as the graded ARC 204 has no distinct layers in each portion 206, 208, 210 and 212 of the graded ARC 204, the refractive index of the graded ARC 204 (at about 633 nm) can be tuned from over about 2.0 to about 1.47. In one embodiment, as the flow of the oxygen reaches about 50 sccm, the refractive index of the ARC 204 is tuned to about 1.47. For example, in one embodiment: (i) at about 0 sccm of oxygen gas, the graded ARC 204 has a refractive index between about 2.0 and about 2.5, for example, about 2.0 or about 2.1; (ii) at about 25 sccm of oxygen gas, the graded ARC 204 has a refractive index of between about 1.5 and about 2.0, for example about 1.75; (iii) at about 50 sccm of oxygen gas, the graded ARC 204 has a refractive index of between about 1.0 and about 1.5, for example about 1.47; (iv) at about 75 sccm of oxygen gas, the graded ARC 204 has a refractive index of between about 1.0 and about 1.5, for example about 1.48 or about 1.49; and (v) at about 100 sccm of oxygen gas, the graded ARC 204 has a refractive index of between about 1.0 and about 1.5, for example about 1.47.

Additionally, as the flow of the oxygen increases to about 100 sccm the graded ARC 204 has a low compressive stress level, i.e., the stress of the graded ARC 204 is tunable with different levels of oxygen gas. For example, in one embodiment: (i) at about 0 sccm of oxygen gas, the graded ARC 204 has a stress level of −599 MPa; (ii) at about 25 sccm of oxygen gas, the graded ARC 204 has a stress level of −276 MPa; (iii) at about 50 sccm of oxygen gas, the graded ARC 204 has a stress level of −144 MPa; (iv) at about 75 sccm of oxygen gas, the graded ARC 204 has a stress level of −157 MPa; and (v) at about 100 sccm of oxygen gas, the graded ARC 204 has a stress level of −119 MPa. Therefore, the graded ARC 204 provides an ARC that gradually controls the refractive index of the filmstack 202 without having to control the thickness of the graded ARC 204, and has low stress levels.

While the foregoing is directed to embodiments of the present invention, other and further embodiments of the invention may be devised without departing from the basic scope thereof, and the scope thereof is determined by the claims that follow.

What is claimed is:

1. A method for forming a graded anti-reflective coating in a physical vapor deposition processing chamber comprising:
   positioning a substrate on a substrate support in the processing chamber below a target;
   flowing a first inert gas into the processing chamber to sputter the target to deposit a first portion of the graded anti-reflective coating onto the substrate, the first portion having a first refractive index;
   gradually flowing a second gas into the processing chamber to deposit a second portion of the graded anti-reflective coating onto the substrate, the second portion having a second refractive index that is less than the first refractive index;
   gradually flowing a third gas into the processing chamber while simultaneously gradually decreasing the flow of the second gas into the processing chamber to deposit a third portion of the graded anti-reflective coating onto the substrate, the third portion having a third refractive index that is less than the second refractive index;
   arriving at a final value of a flow rate of the third gas to tune a stress level of the graded anti-reflective coating; and
   flowing the third gas into the processing chamber after stopping the flow of the second gas to form a fourth portion of the graded anti-reflective coating, the fourth portion having a fourth refractive index that is less than the third refractive index.

2. The method of claim 1, wherein the first gas is argon gas flowed at about 30 sccm.

3. The method of claim 1, wherein the second gas and third gas are selected from a group comprising nitrogen gas (N$_2$), nitrogen dioxide (NO$_2$), fluorine gas (F$_2$), oxygen gas (O$_2$), hydrogen gas (H2), H$_2$O in vapor form, methane (CH4), carbon monoxide (CO), methane (CH$_4$), and carbon dioxide (CO$_2$).

4. The method of claim 3, wherein the second gas is nitrogen gas, the third gas is oxygen gas and that target comprises silicon.

5. The method of claim 4, wherein the first portion comprises silicon.

6. The method of claim 5, wherein the nitrogen gas is gradually flowed at about 100 sccm and the second portion comprises silicon and nitrogen.

7. The method of claim 6, wherein the oxygen gas is gradually flowed at between about 0 sccm to about 100 sccm, and the third portion comprises silicon, nitrogen and oxygen.

8. The method of claim 7, wherein the nitrogen gas is gradually flowed while the oxygen gas is gradually flowed.

9. The method of claim 7, wherein the nitrogen gas is gradually extinguished while the oxygen gas is gradually flowed.

10. The method of claim 9, wherein the fourth portion comprises silicon and oxygen.

11. A method for forming a graded anti-reflective coating comprising:
    positioning a substrate on a substrate support in a physical vapor deposition chamber below a silicon target;
    sputtering the silicon target with argon gas to deposit a first portion of the graded anti-reflective coating onto the substrate, the first portion having a first refractive index;
    gradually flowing nitrogen gas into the processing chamber to deposit a second portion of the graded anti-reflective coating onto the substrate, the second portion having a second refractive index that is less than the first refractive index;
    gradually flowing oxygen gas into the processing chamber while simultaneously gradually decreasing the flow of the nitrogen gas into the processing chamber to deposit a third portion of the graded anti-reflective coating onto the substrate, the third portion having a third refractive index that is less than the second refractive index;
    arriving at a final value of a flow rate of the oxygen gas to tune a stress level of the graded anti-reflective coating; and
    flowing the oxygen gas into the processing chamber after stopping the flow of the nitrogen gas to form a fourth portion of the graded anti-reflective coating onto the substrate, the fourth portion having a fourth refractive index that is less than the third refractive index.

12. The method of claim 11, wherein the physical vapor deposition chamber pressure is less than about 100 mTorr and at room temperature.

13. The method of claim 12, wherein DC power in the physical vapor deposition chamber is less than about 20 kW and pulsed at a frequency of about 100 kHz and a duty cycle of about 97%.

14. The method of claim 13, wherein the physical vapor deposition chamber pressure is about 10 mTorr and the DC power is about 6 kW.

* * * * *